(12) United States Patent
Sumiya et al.

(10) Patent No.: US 7,771,608 B2
(45) Date of Patent: Aug. 10, 2010

(54) PLASMA PROCESSING METHOD AND APPARATUS

(75) Inventors: Masahiro Sumiya, Hikari (JP); Tsutomu Iida, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 741 days.

(21) Appl. No.: 11/699,067

(22) Filed: Jan. 29, 2007

(65) Prior Publication Data

US 2008/0068774 A1 Mar. 20, 2008

(30) Foreign Application Priority Data

Sep. 15, 2006 (JP) .............................. 2006-250206

(51) Int. Cl.
*B44C 1/22* (2006.01)
*C03C 15/00* (2006.01)
*C03C 25/68* (2006.01)
*C23F 1/00* (2006.01)

(52) U.S. Cl. ........................................ 216/67; 438/714
(58) Field of Classification Search .................. 216/67, 216/71; 438/714, 10
See application file for complete search history.

(56) References Cited

U.S. PATENT DOCUMENTS 6,195,616 B1 2/2001 Reed et al.

FOREIGN PATENT DOCUMENTS

| JP | 8-124913 A | 5/1996 |
| JP | 11-274141 A | 10/1999 |
| KR | 2002057688 A | * 7/2002 |

* cited by examiner

*Primary Examiner*—Roberts Culbert
(74) *Attorney, Agent, or Firm*—McDermott Will & Emery LLP

(57) ABSTRACT

A plasma processing method using a plasma processing apparatus comprising a vacuum processing chamber, a substrate electrode having an electrostatic chucking film for chucking a material to be processed, an electrostatic chucking DC power supply and a substrate bias high-frequency power supply connected to the substrate electrode, and a plasma generating unit for generating the plasma in the vacuum processing chamber. The high-frequency voltage Vpp applied to the substrate electrode is monitored, and based on the Vpp signal thus monitored, the output voltage of the electrostatic chucking DC power supply is controlled thereby to maintain the voltage applied on the electrostatic chucking film at the desired value while at the same time controlling the output of the substrate bias high-frequency power supply in ramp with time.

2 Claims, 3 Drawing Sheets

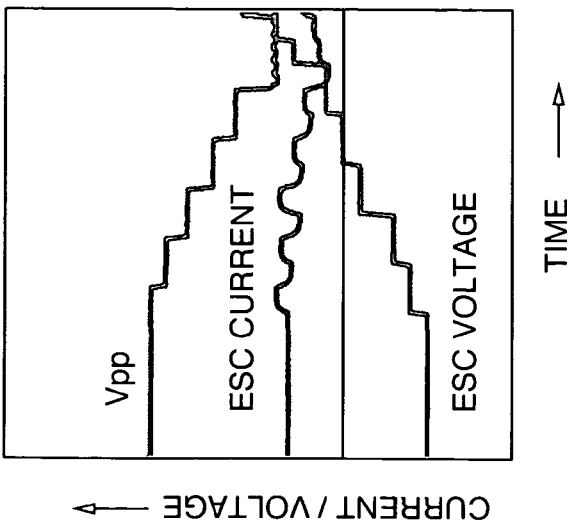
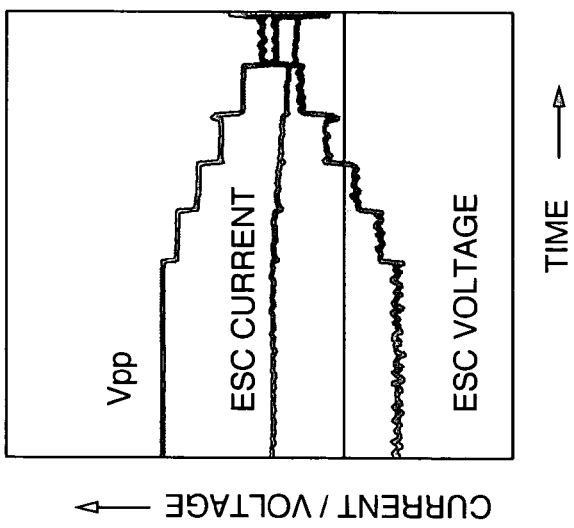
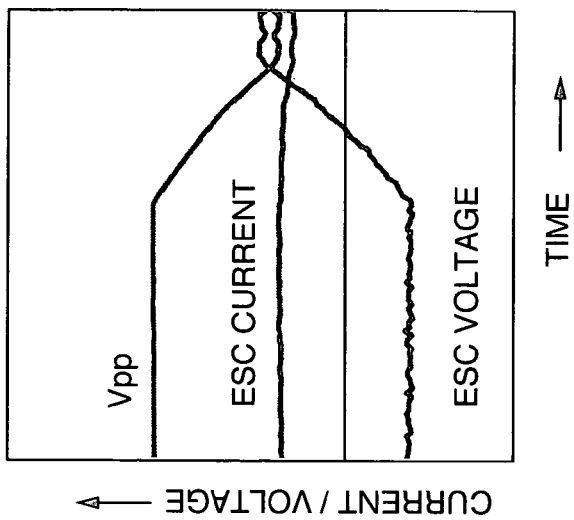

PLASMA PROCESSING METHOD AND APPARATUS

BACKGROUND OF THE INVENTION

This invention relates to a plasma processing apparatus, or in particular to a plasma processing method and apparatus suitable for surface treatment of a semiconductor element using the plasma.

It is important to control the temperature of a wafer as a material to be processed (hereinafter referred to as the object material) in the fabrication process of a semiconductor device. As a means to solve this problem, a method is known in which a cooling gas is introduced to produce the cooling effect between the wafer and a substrate electrode, which has an electrostatic chucking film and supports the wafer (JP-A-11-274141).

Also, in the case where the etching process is executed using the plasma processing apparatus, the processing gas is ionized and activated to increase the processing rate and the high-frequency bias power is supplied to the object material in order to cause the ions to enter the object material perpendicularly. In this way, the etching process of high accuracy for an anisotropic shape is realized. Generally, ions enter the object material by being accelerated by the self-bias potential generated by the high-frequency bias power supplied to the object material. By increasing the high-frequency bias power applied to the object material and by thus increasing the self-bias potential, therefore, high-energy ions can be applied to the object material.

As described above, the wafer is mounted on the substrate electrode through the electrostatic chucking film, and a DC voltage is applied to the substrate electrode to chuck the wafer electrostatically. The electrostatic chucking film, therefore, is applied with a voltage corresponding to the difference between the self-bias potential of the wafer and the DC voltage applied to the substrate electrode. In connection with this, a method is known in which the high-frequency voltage of the substrate electrode is monitored, and a predetermined voltage is applied to the electrostatic chucking film (U.S. Pat. No. 6,198,616).

Also, a method is known in which the self-bias voltage of the semiconductor wafer is monitored, the difference between the DC voltage for electrostatic chucking (hereinafter referred to as the electrostatic chucking DC voltage) and the self-bias voltage is calculated, and the electrostatic chucking DC voltage is controlled to secure a constant absolute value of the voltage difference (JP-A-8-124913).

SUMMARY OF THE INVENTION

Recently, the stepped etching with the conditions varied from one film to another has been used frequently in keeping with the stack structure. A sharp change in the high-frequency power applied to the substrate electrode for each step, however, applies an excessively high voltage to the electrostatic chucking film instantaneously and may cause the problem of dielectric breakdown. Therefore, a system having a higher reliability is required to be realized against the wafer chucking and the dielectric breakdown for each step.

The object of this invention is to provide a plasma processing method and apparatus having a high reliability in the chucking of a wafer to the substrate electrode.

According to one aspect of the invention, there is provided a method of plasma processing of an object material using a plasma processing apparatus configured of a vacuum processing chamber, a substrate electrode having an electrostatic chucking film for chucking an object material, an electrostatic chucking DC power supply and a substrate bias high-frequency power supply connected to the substrate electrode and a plasma generating means for generating the plasma in the vacuum processing chamber, comprising the steps of monitoring a high-frequency voltage Vpp applied to the substrate electrode and controlling the output voltage of the electrostatic chucking DC power supply based on the voltage Vpp monitored thereby to maintain the voltage applied on the electrostatic chucking film at a desired value, and controlling the output of the substrate bias high-frequency power in ramp with time.

According to another aspect of the invention, there is provided a plasma processing apparatus comprising a vacuum processing chamber, a substrate electrode having an electrostatic chucking film for chucking an object material, an electrostatic chucking DC power supply and a substrate bias high-frequency power supply connected to the substrate electrode, an antenna electrode arranged at a position in opposed relation to the substrate electrode, a plasma generating high-frequency power supply and an antenna bias high-frequency power supply connected to the antenna electrode and a phase controller for monitoring the phases of the high frequencies output from the substrate bias high-frequency power supply and the antenna bias high-frequency power supply and controlling the phase difference between the two power supplies, the apparatus further comprising a means for monitoring the high-frequency voltage Vpp applied on the substrate electrode, an electrostatic chucking voltage regulator for controlling the output voltage of the electrostatic chucking DC power supply based on the Vpp signal thus monitored, and a controller for controlling, in ramp with time, the output of the substrate bias high-frequency power supply, the plasma-generating high-frequency power supply or the antenna bias high-frequency power supply.

Even in the case where the self-bias potential of the wafer is changed by the change in the etching conditions, the voltage applied on the electrostatic chucking film can be controlled at a predetermined level, and therefore, the chucking of the wafer to the substrate electrode can be stabilized for an improved reliability of the etching process.

Other objects, features and advantages of the invention will become apparent from the following description of the embodiments of the invention taken in conjunction with the accompanying drawings.

BRIEF DESCRIPTION OF THE DRAWINGS

FIGS. 3A to 3C are characteristic diagrams showing the chucking characteristic of the wafer to the substrate electrode with or without the automatic control operation of the ESC voltage and the ramp control of the substrate bias power supply.

DETAILED DESCRIPTION OF THE INVENTION

Figure 1:
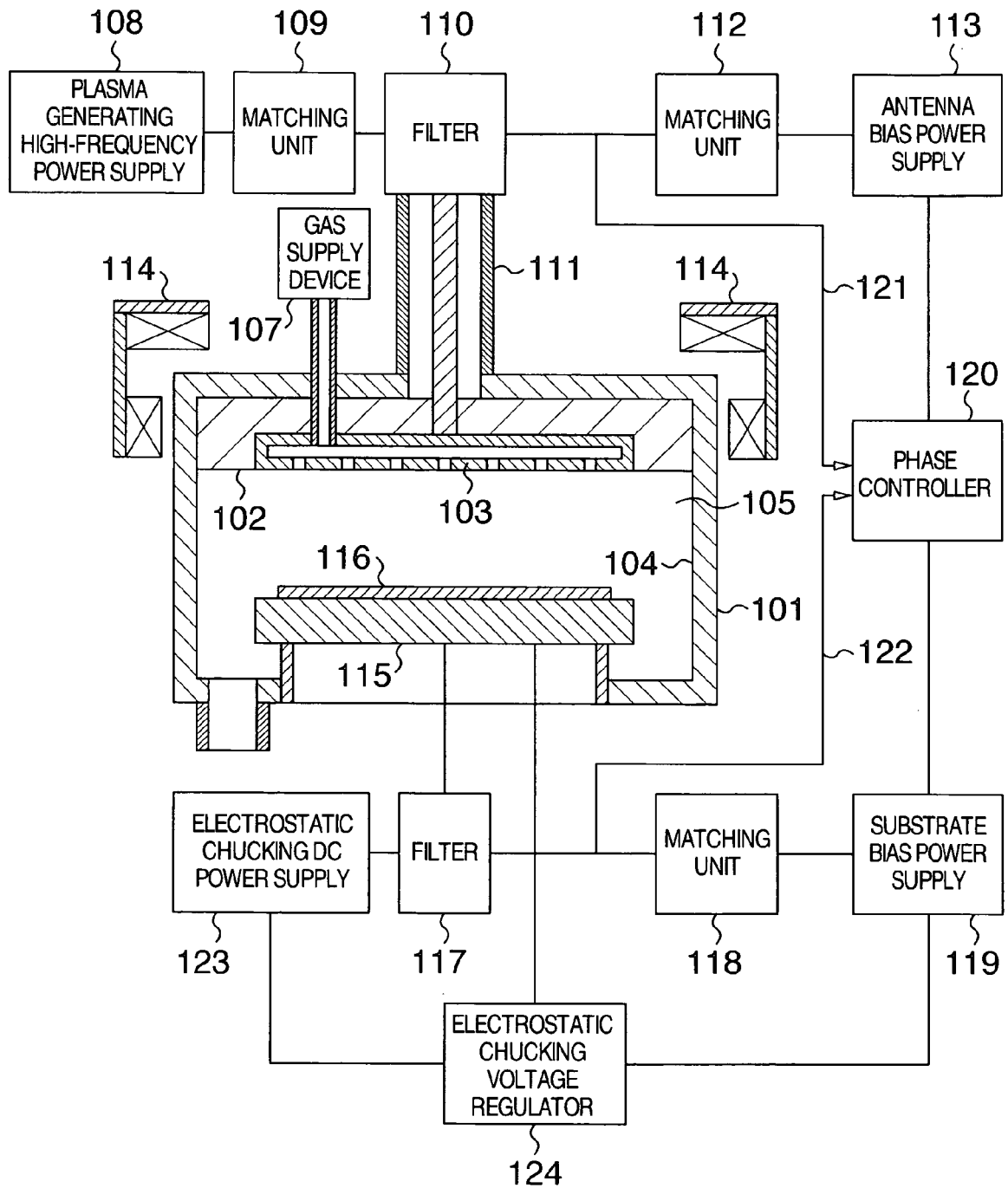
FIG. 1 is a longitudinal sectional view showing an etching device according to a first embodiment of the invention.

An embodiment of the invention is explained below with reference to FIGS. 1 to 3. FIG. 1 is a longitudinal sectional view showing an etching device constituting a plasma processing apparatus according to an embodiment of the invention. A processing container 104, a dielectric window 102 (formed of quartz, for example) and an antenna electrode 103 (formed of Si, for example) are arranged and sealed in the upper part of a vacuum container 101 open on the upper side thereby to form a processing chamber 105. The antenna electrode 103 having a porous structure for supplying an etching gas is connected to a gas supply device 107. The vacuum container 101 is connected with a vacuum exhaust device (not shown) through a vacuum exhaust port 106. The upper part of the antenna electrode 103 is connected with a plasma-generating high-frequency power supply 108 (for example, 100 MHz to 450 MHz in frequency) and an antenna bias power supply 113 (for example, 400 kHz to 5 MHz in frequency) through a coaxial cable line 111, a filter 110 and a matching unit 109 and a matching unit 112. The antenna bias power supply 113, of which the oscillation can be controlled by an external trigger signal, has the function to scavenge the fluorine in the plasma on the surface of the antenna electrode. The substrate electrode 115 on which to mount the object material 116 is arranged in the lower part of the vacuum container 101 in opposed relation to the antenna electrode. The substrate electrode 115 has a cooling mechanism and an electrostatic chucking film (not shown) and can supply the cooling gas between the object material 116 and the electrostatic chucking film. The cooling gas can be controlled to an arbitrary pressure. The substrate electrode 115 is connected, through a filter 117, with an electrostatic chucking DC power supply (ESC) 123 to chuck the object material 116 electrostatically on the one hand and with a substrate bias power supply 119 (for example, 400 kHz to 5 MHz in frequency) through a matching unit 118 on the other hand. The substrate bias power supply 119, of which the oscillation can be controlled by an external trigger signal, has the function to render ions in the plasma to enter in the perpendicular to the substrate. Also, the antenna bias power supply 113 and the substrate bias power supply 119 are connected to a phase controller 120 to monitor the phases of the high frequencies output from the antenna bias power supply 113 and the substrate bias power supply 119 thereby to control the phase difference therebetween. The antenna bias power supply 113 and the substrate bias power supply 119 can be controlled to the desired phase based on the signals of phase detecting probes 121, 122. Also, one of the antenna bias power supply 113 and the substrate bias power supply 119 has the function as an earth against the high frequency of the other.

In the apparatus configured as described above, after decompressing the interior of the processing chamber 105 by a vacuum exhaust device (not shown), the etching gas is introduced into the processing chamber 105 by a gas supply device 107 thereby to regulate the pressure to the desired level. The high-frequency power generated from the high-frequency power supply 108 is propagated through the coaxial cable line 111 and introduced into the processing chamber 105 through the antenna electrode 103 and the dielectric window 102. The matching unit 109 is connected between the high-frequency power supply 108 and the coaxial cable line 111, so that the high-frequency power output from the high-frequency power supply 108 is efficiently supplied into the processing chamber 105. Also, a high-density plasma is generated in the processing chamber 105 by the interaction with the magnetic field formed by a magnetic field generating coil 114 (such as a solenoid coil). Especially, in the case where a magnetic field strength (160 G, for example) causing an electron cyclotron resonance is formed in the processing chamber 105, a high-density plasma can be generated efficiently. Also, high-frequency power is supplied to the antenna electrode 103 from the antenna bias power supply 113 through the matching unit 112 and the coaxial cable line 111. In the process, a filter 110 arranged between the matching units 109, 112 and the coaxial cable line 111 so functions that the high-frequency power output from the high-frequency power supply 108 is charged efficiently in the direction along the coaxial cable line 111 on the one hand and the high-frequency power output from the antenna bias power supply 113 is efficiently applied in the direction along the coaxial cable line 111 on the other hand. Also, the object material 116 mounted on the substrate electrode 115 is supplied with high-frequency power from the substrate bias power supply 119 through the matching unit 118 thereby to execute the surface treatment (such as etching). Further, the substrate electrode 115 is connected with the electrostatic chucking DC power supply 123 and can chuck the object material 116. Also, a filter 117 is connected between the electrostatic chucking DC power supply 123 and the matching unit 118 so that the power output from the substrate bias power supply 119 and the electrostatic chucking DC power supply 123 can be applied efficiently to the substrate electrode 115.

Also, the electrostatic chucking DC power supply 123 is connected with an electrostatic chucking voltage regulator 124. The electrostatic chucking voltage regulator 124 monitors the high-frequency voltage Vpp (peak-to-peak voltage) of the substrate electrode 115, determines the self-bias potential on the wafer from the Vpp signal signal thus monitored, and automatically controls the voltage applied on the electrostatic chucking film to the desired level in real time.

In etching the stacked film, for example, the etching recipe is varied from one film to another, and the self-bias potential on the wafer may change. Upon application of a predetermined DC voltage to the substrate electrode, the voltage applied on the electrostatic chucking film may run short and the resulting shortage of the chucking force may separate the wafer from the substrate electrode in some cases. Upon application of an excessive voltage to the electrostatic chucking film, on the other hand, may pose the problem that a trouble such as the abnormal discharge occurs in the apparatus.

In view of this, according to this invention, the voltage applied on the electrostatic chucking film is controlled within the desired tolerable value, thereby improving the reliability of the etching process.

The self-bias potential on the wafer is calculated in the manner described below from the voltage Vpp of the substrate electrode 115. FIG. 2 shows the relation between the ratio of the self-bias potential Vdc of the wafer constituting the object material 116 to the voltage Vpp of the substrate electrode 115 and the bias phase difference between the antenna electrode 103 and the substrate electrode 115. The voltage Vdc is a value equal to the maximum value of the bias voltage, less one half of the voltage Vpp (peak-to-peak voltage) of the bias voltage applied on the wafer. The ratio Vdc/Vpp assumes a minimum value of −0.45 at the phase difference of 180 degrees and a maximum value of about −0.18 at the phase difference of zero degree. This measurement result is derived from an experiment conducted with a wide electrode interval of about 70 mm between the antenna electrode 103 and the substrate electrode 115, and in the case where a similar measurement is made with a narrow electrode interval of about 20 mm to 40 mm, the ratio Vdc/Vpp assumes the value of about −0.45 for the phase difference of 180 degrees, while the ratio Vdc/Vpp is about zero for the phase difference of zero degree. By acquiring the data on each electrode interval and the self-bias voltage for the phase difference between the antenna electrode 103 and the substrate electrode 115 and forming a data base and a function (model formula), therefore, the self-bias potential on the object material 116 can be estimated by measuring the voltage Vpp of the substrate electrode 115.

Based on these data, the voltage applied on the electrostatic chucking film is automatically controlled to the desired level.

Specifically, the voltage applied to the electrostatic chucking film, the phase difference between the high-frequency voltages applied to the antenna electrode 103 and the substrate electrode 115 and the interval between the antenna electrode 103 and the substrate electrode 115 are set in a recipe, and the output voltage of the electrostatic chucking DC power supply can be automatically controlled to the desired value using the value thus set or the Vpp monitor value.

Further, this invention is realized by a controller for increasing or decreasing the output of the substrate bias power supply 119 in ramp with time. The matching unit 118 operates to minimize the reflector power of the RF output. Since the response rate thereof is limited, however, a sharp change in the applied power causes an instantaneous mismatched state. Thus, the voltage Vpp of the substrate electrode 115 undergoes a great change, and in the case where the time response of the electrostatic chucking DC power supply 123 and the electrostatic chucking voltage regulator 124 against the particular change is insufficient, the voltage applied on the electrostatic chucking film may change instantaneously. In view of this, the high-frequency output is increased or decreased in ramp with time to eliminate the mismatching in the matching unit 118. Thus, the voltage applied on the electrostatic chucking film is stabilized and can be controlled to the desired value.

Also, at the time of application of a high-frequency output or in the case where the output thereof is changed, the plasma state is changed. Especially, in the case where the output of the high-frequency power applied to the substrate is larger than the plasma generating power or a high-output bias power (2 kW to 10 kW) is applied, the high-frequency power applied to the substrate has a great effect on the plasma state. In order to suppress the change (instability) of the plasma state, therefore, the rate at which the high frequency output is increased or decreased in ramp with time is effectively set to not higher than 2 kV/sec having no effect on the plasma state.

Further, the rate at which the high-frequency output is increased or decreased in ramp with time is determined by monitoring the output voltage of the electrostatic chucking DC power supply 123 or the voltage Vpp of the substrate electrode 115 and monotonically increasing or decreasing the change in the voltages, thereby effectively improving the processing stability.

Specifically, the change rate of the output voltage of the electrostatic chucking DC power supply 123 or the Vpp signal of the substrate electrode 115 monitored is calculated by an arithmetic circuit, and the rate at which the high-frequency output is increased or decreased in ramp with time is controlled in real time in such a manner that the change rate is not higher than the desired value. As a result, the high-frequency output can be controlled to secure an always stable plasma discharge state. Thus, the voltage Vpp generated by the substrate electrode 115 is stabilized, and the voltage control accuracy of the electrostatic chucking film is improved. As a result, the etching process can be executed always in stable fashion.

Also, at the time of discharge ignition, the plasma impedance undergoes a considerable change, and therefore, the matching point of the matching unit 118 may also greatly change. In such a case, during the time before the discharge is ignited and stabilized, the position of the matching unit is fixed at the desired matching point. In this way, the voltage Vpp generated on the wafer can be effectively stabilized.

Apart from the substrate bias power supply 119 described above, the output of the antenna bias power supply 113 and the high-frequency power supply 108 may be similarly controlled in ramp with time.

FIGS. 3A to 3C show an example of an actual experiment in which the voltage applied on the electrostatic chucking film is automatically controlled. The abscissa represents the time and the ordinate the substrate electrode voltage Vpp, the ESC current flowing in the electrostatic chucking film and the ESC voltage. By changing the voltage Vpp of the substrate electrode 115, the voltage applied on the electrostatic chucking film is automatically controlled as shown in FIG. 3A. The output of the electrostatic chucking DC power supply, however, is changed stepwise for each change of the voltage Vpp in such a manner that the voltage applied on the electrostatic chucking film is controlled within the desired tolerance as far as possible. FIG. 3B shows a case in which the voltage applied on the electrostatic chucking film is automatically controlled, and FIG. 3C a case in which the voltage applied on the electrostatic chucking film is automatically controlled and the output of the substrate bias power supply is controlled in ramp with time. The ESC current is proportional to the voltage applied on the electrostatic chucking film, and the smaller the waveform irregularities, the more stable the chucking of the wafer to the substrate electrode. As compared with FIG. 3A, it is understood that the irregularities of the ESC current in FIGS. 3B and 3C are decreased in that order. By controlling the ESC voltage automatically and the substrate bias power supply in ramp, therefore, the chucking of the wafer to the substrate electrode can be stabilized, thereby improving the reliability of the etching process.

Figure 2:
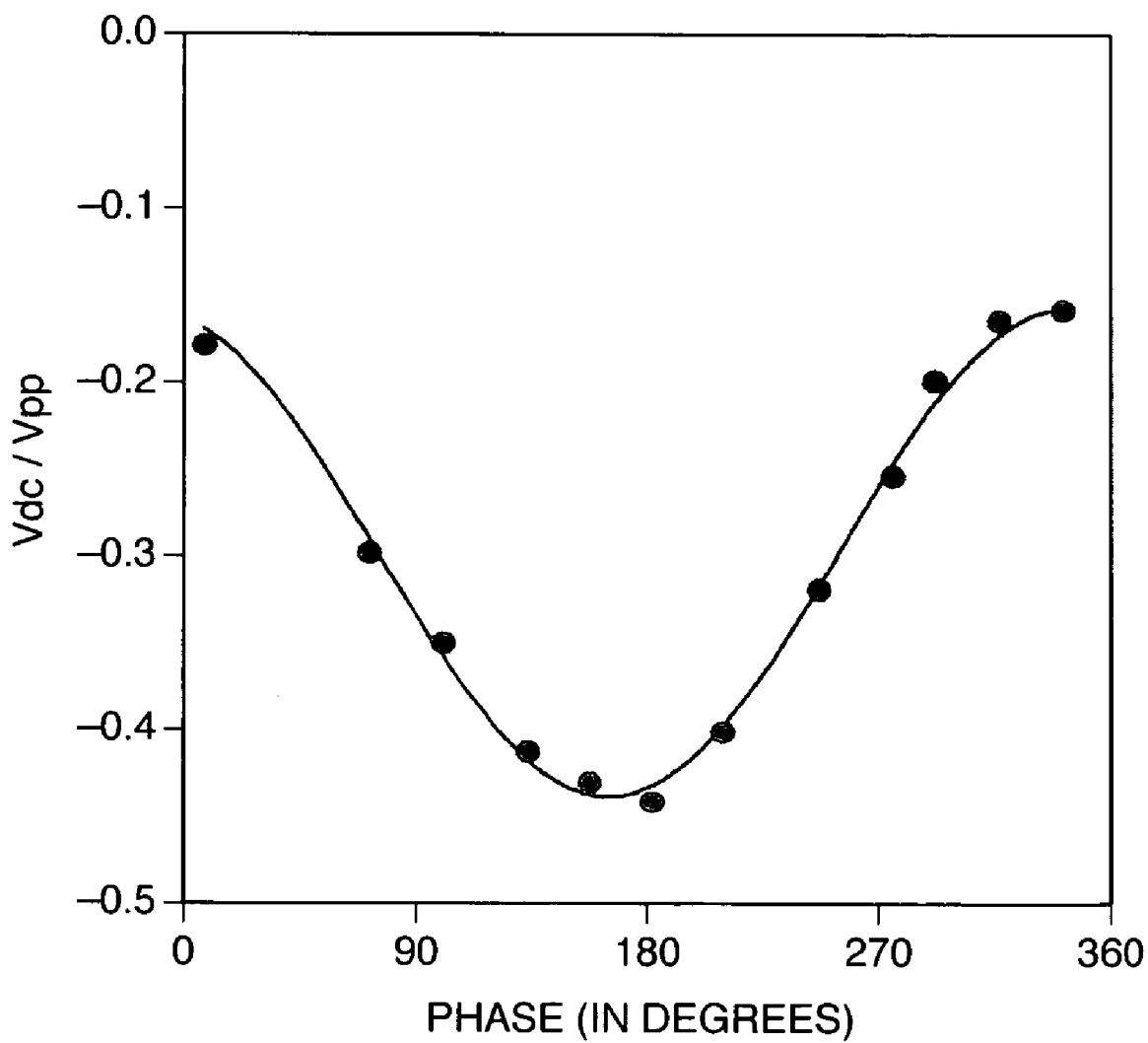
FIG. 2 is a characteristic diagram showing the relation between the self-bias voltage and the phase difference.

Further, FIG. 2 shows the manner in which the self-bias potential is considerably changed by the phase difference between the antenna electrode 103 and the substrate electrode 115. The process can be stabilized effectively also by monitoring the phase difference signal, inputting the same signal directly to the electrostatic chucking voltage regulator 124 and controlling the voltage applied on the electrostatic chucking film. The phase difference between the antenna electrode 103 and the substrate electrode 115 can be changed by the recipe for etching and cleaning the chamber interior and may be used by changing among the etching steps. The chucking of the wafer to the substrate electrode can be stabilized more by monitoring the phase difference between the antenna electrode 103 and the substrate electrode 115 directly and controlling the voltage applied on the electrostatic chucking film by the electrostatic chucking voltage regulator 124 using the particular signal. Thus, the reliability of the etching process is improved.

In the aforementioned embodiment, the etching device having the plasma-generating high-frequency power supply, the antenna, the high-frequency power supply having the phase control function for the substrate electrode are explained. Nevertheless, this invention is applicable also with equal effect to other etching devices such as the inductively coupled plasma device and the plane-parallel plate plasma device, and other plasma processing apparatuses including the ashing device and the plasma CVD device in which the high-frequency power is supplied to the substrate electrode and the wafer is chucked to the substrate electrode using the electrostatic chucking film.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A method of plasma processing an object material using a plasma processing apparatus including a vacuum processing chamber, a substrate electrode having an electrostatic chucking film for chucking the object material, an electrostatic chucking DC power supply and a substrate bias high-frequency power supply connected to the substrate electrode and a means for generating the plasma in the vacuum processing chamber, comprising the steps of:

monitoring a high-frequency voltage applied to the substrate electrode; and controlling the output voltage of the electrostatic chucking DC power supply based on a signal representing the monitored high-frequency voltage to maintain the voltage applied on the electrostatic chucking film at a desired value while at the same time controlling the output of the substrate bias high-frequency power in ramp with time, wherein the rate at which the output of the substrate bias high-frequency power supply is increased or decreased in ramp with time is controlled in such a manner that the change rate is calculated from a selected one of the output voltage of the electrostatic chucking DC power supply and the high-frequency voltage signal and maintained at no more than the desired value.

2. A method of plasma processing an object material using a plasma processing apparatus including a vacuum processing chamber, a substrate electrode having an electrostatic chucking film for chucking the object material, an electrostatic chucking DC power supply and a substrate bias high-frequency power supply connected to the substrate electrode, an antenna electrode arranged at a position in opposed relation to the substrate electrode, a plasma generating high-frequency power supply and an antenna bias high-frequency power supply connected to the antenna electrode, and a phase controller for monitoring the phase of the high frequencies output from the substrate bias high-frequency power supply and the antenna bias high-frequency power supply and controlling the phase difference therebetween, comprising the steps of:

monitoring a high-frequency voltage applied to the substrate electrode; and controlling the output voltage of the electrostatic chucking DC power supply based on a signal representing the monitored high-frequency voltage to maintain the voltage applied on the electrostatic chucking film at a desired value while at the same time controlling the output of a selected one of the substrate bias high-frequency power supply, the plasma generating high-frequency power supply and the antenna bias high-frequency power supply in ramp with time, wherein the output voltage of the electrostatic chucking DC power supply is controlled based on the phase difference set by the phase controller, the high-frequency voltage signal and the distance between the substrate electrode and the antenna electrode.

* * * * *